(12) United States Patent
Delage et al.

(10) Patent No.: US 9,252,563 B1
(45) Date of Patent: Feb. 2, 2016

(54) METHOD AND APPARATUS FOR DRIVING A LASER DIODE

(71) Applicant: PMC-SIERRA US, INC., Sunnyvale, CA (US)

(72) Inventors: Jean-François Delage, Montreal (CA); Guillaume Fortin, Montreal (CA); Tiberiu Galambos, Biniamina (IL)

(73) Assignee: PMC-Sierra US, Inc., Sunnyvale, CA (US)

( * ) Notice: Subject to any disclaimer, the term of this patent is extended or adjusted under 35 U.S.C. 154(b) by 86 days.

(21) Appl. No.: 13/787,351

(22) Filed: Mar. 6, 2013

Related U.S. Application Data

(60) Provisional application No. 61/607,351, filed on Mar. 6, 2012.

(51) Int. Cl.
*H01S 3/00* (2006.01)
*H01S 5/042* (2006.01)

(52) U.S. Cl.
CPC .................................. *H01S 5/0427* (2013.01)

(58) Field of Classification Search
CPC ...................................................... H01S 5/0427
USPC .................................. 372/38.1, 38.02, 38.07
See application file for complete search history.

(56) References Cited

U.S. PATENT DOCUMENTS

| | | | |
|---|---|---|---|
| 2007/0081567 A1* | 4/2007 | Lam et al. | 372/38.07 |
| 2008/0117943 A1* | 5/2008 | Nishiyama | 372/29.02 |
| 2009/0014752 A1* | 1/2009 | Ueda et al. | 257/103 |

* cited by examiner

*Primary Examiner* — Yuanda Zhang
(74) *Attorney, Agent, or Firm* — Dennis R. Haszko

(57) ABSTRACT

A method and apparatus for powering up and powering down a laser diode and its driver are disclosed. The disclosed method and apparatus enable the use of deep sub-micron CMOS technology to build a laser diode driver (LDD), while ensuring the low voltage limits prescribed by such technology are not exceeded. Building an LDD with deep sub-micron CMOS technology pushes circuit integration further ahead, bringing cost of LDDs and required board circuits down.

5 Claims, 12 Drawing Sheets

⬈ 600

Generate a first biasing current to pre-charge a laser diode supply biasing inductor of the laser diode circuit, the first biasing current flowing through a first node connected to a first terminal of a laser diode of the laser diode circuit while bypassing the laser diode
605

Generate a first modulation current to pre-charge the laser diode supply biasing inductor, the first modulation current flowing through the first node while bypassing the laser diode
610 divert the first biasing current from the first node to a second biasing current flowing through the laser diode and a second node connected to a second terminal of the laser diode to create a second biasing current
615 switch between the first modulation current flowing through the node and a second modulation current flowing through laser diode and the second node to modulate a light emitted by the laser diode
620

Divert a first modulation current flowing through a laser diode of the laser diode circuit and a first node connected to a first terminal of the laser diode to a second modulation current flowing through a second node connected to a second terminal of the laser diode and bypassing laser diode    705

Divert a first biasing current flowing through the laser diode and the first node to a second biasing current flowing through the second node and bypassing the laser diode    710

Decrease the second Biasing current to a value corresponding to a power-down mode of the laser diode circuit    715

Decrease the second modulation current to a value corresponding to a power-down mode of the laser diode circuit    720

Divert a first modulation current, drawn by a first modulation current source from a first node connected to a first terminal of a laser diode of the laser diode circuit, to a second modulation current flowing through a second node connected to a second terminal of the laser diode and bypassing the laser diode using a second modulation current source

1205

Divert a first biasing current, drawn by a first biasing current source from the first node, to the second node and bypassing the laser diode using a second biasing current source

1210

Adjust the first modulation current to a modulation current target value and/or the first biasing current to a biasing current target value

1215

Divert the second biasing current to the adjusted first biasing current

1220

Divert the second modulation current to the adjusted first modulation current

METHOD AND APPARATUS FOR DRIVING A LASER DIODE

CROSS REFERENCE TO RELATED APPLICATIONS

This application claims the benefit of priority of U.S. Provisional Patent Application No. 61/607,351 filed Mar. 6, 2012, which is incorporated herein by reference in its entirety.

FIELD

The present disclosure relates generally to laser diodes and laser diode drivers. Specifically, the present disclosure relates to laser diodes and laser diode drivers used in optical communication systems.

BACKGROUND

Several methods exist to transmit light information over optical fiber links. High end/high performance systems generally use lasers as sources of coherent beams of light, along with some form of an optical modulator. Electrical signals control the optical modulator to modulate light: such modulators can affect the amplitude, phase, and/or frequency of the transmitted light stream. Lower end/lower rate systems such as first generation Ethernet Passive Optical Network (EPON) or Gigabit Passive Optical Network (GPON), on the other hand, directly modulate the current fed to a laser diode, resulting in a modulated light stream.

Direct modulation may be cost effective as it does not require expensive modulators or light sources. However, this method usually imposes a limit on the maximum modulation rates at which a link can be operated. Low-cost lasers are typically encapsulated into lead packages which exhibit high inductance that can limit the bandwidth of laser diode circuits. Lower bandwidths lead to higher inter-symbol interference (ISI) and complicate data recovery. ISI results from the unsettled circuit response to a change in symbol (or bit for 1-bit symbols) values. Unsettled responses can cumulate and lead to blurring that can makes information recovery tedious.

Also, laser diodes can produce spurious light emissions at the onset and cessation of coherent light emission, known as "chirping", which further impairs data recovery. The "chirp effect" is a high frequency ringing of the emitted light's amplitude that occurs during the turn-on phase of a laser. It is a non-linear behavior that cannot be compensated and which closes the optical eye. The shorter the unit interval (UI) of a bit stream, the more pronounced the impact this effect has on the eye quality, because the chirp is of fixed duration and thus does not scale with the bit duration. The extent and magnitude of the chirp can be minimized by ensuring the laser diode is properly biased.

A laser diode driver (LDD) is used to bias a laser diode and to modulate its current. The laser diode load driven by the LDD often presents large inductive characteristics that result in high voltage transients during modulation. The inductive characteristics are commonly caused by three effects: (1) the low-cost packaging techniques used for the discrete laser diode, which introduces parasitic inductors due to the package leads and bond wires; (2) inductors and components involved in circuit bandwidth extension techniques; and (3) inductors used isolate bias current from modulation currents.

In this kind of environment, potential peaks of several volts can be observed during transients induced by changing the bias and modulation currents of the laser diode.

Traditionally, LDDs come as discrete components and are placed on printed circuit boards. They are built using robust and proven semiconductor technologies (typically bipolar) adapted for analog design, and can sustain the large voltages required to drive laser diodes. Normally, LDDs interface with digital integrated circuit (IC) controllers, typically built using complementary metal-oxide-semiconductor (CMOS) technology. The controllers provide the traffic payload which is converted by an LDD into a signal suitable to operate a laser diode. LDDs therefore sit between the IC controller and laser diodes. The digital payload received by LDDs consists of a serialized bit stream that takes the form of an electrical voltage signal, since proper data serialization must take place before reaching the laser driver. Communication between the controller and the LDD uses standard signaling schemes, for example, low-voltage positive emitter-coupled logic (LV-PECL) to enforce a clear definition of electrical levels and timing specifications. This ensures the information transmitted to the LDD is correctly interpreted.

Recently, there has been interest in building LDDs through mainstream CMOS processes, as the LDDs can then be integrated into the digital IC controller, resulting in reduced cost, power and area. Modern CMOS processes are, however, not optimized for analog design, and cannot tolerate the large voltage transients required to drive a laser diode due to the transistors' small feature sizes. These large voltage transients cause electrical overstress (EOS) conditions on the circuit and premature wear of the output transistors, resulting in reduced performance and lifetime.

It is, therefore, desirable to provide a method to reduce the transient voltage peaks generated by laser diode circuits, making possible the integration of LDDs in mainstream CMOS technologies.

SUMMARY

It is an object of the present disclosure to obviate or mitigate at least one disadvantage of previous laser diode circuits and/or laser diode drivers.

In a first aspect, the present disclosure provides a method to control biasing and modulation currents of a laser diode circuit. The method comprises generating a first biasing current to pre-charge a laser diode supply biasing inductor of the laser diode circuit, the first biasing current flowing through a first node connected to a first terminal of a laser diode of the laser diode circuit while bypassing the laser diode; generating a first modulation current to pre-charge the laser diode supply biasing inductor, the first modulation current flowing through the first node while bypassing the laser diode; diverting the first biasing current from the first node to a second biasing current flowing through the laser diode and a second node connected to a second terminal of the laser diode; and switching between the first modulation current flowing through the first node and a second modulation current flowing through the laser diode and the second node to modulate a light emitted by the laser diode.

In an example embodiment, the first biasing current and the first modulation current may be generated using a first biasing current source and a first modulation current source, respectively. In another example embodiment, the second biasing current may be generated using a second biasing current source. In yet another example embodiment, the second modulation current may be generated using a second modulation current source.

In an example embodiment, at least one of the first biasing current source, the second biasing current source, the first modulation current source and the second modulation current source may be connected to components of the laser diode circuit through equalization devices, parasitic inductors, parasitic capacitors or a combination thereof. Additionally, other components may be added in parallel between the nodes.

In an example embodiment, the first biasing current and the second current may be complementary. In another example embodiment, the first modulation current and the second modulation current may be complementary.

In an example embodiment, a light emitted by the laser diode may be modulated in accordance with a digital pattern to be transmitted over an optical communication channel.

In an example embodiment, the method may further comprise varying a rate of generation of the first biasing current over time. The rate of generation of the first biasing current may be maintained within a first biasing threshold limit to prevent electrical overstress conditions on components of the laser driver circuit and to prevent spurious light emissions from the laser diode.

In an example embodiment, the method may further comprise varying a rate of generation of the first modulation current over time. The rate of generation of the first modulation current may be maintained within a first modulation threshold limit to prevent electrical overstress conditions on components of the laser driver circuit and to prevent spurious light emissions from the laser diode.

In an example embodiment, the method may further comprise diverting the first biasing current to the second biasing current at a rate maintained within a second biasing threshold limit to prevent electrical overstress conditions on components of the laser driver circuit.

In an example embodiment, the laser diode circuit may include at least one cascoded laser diode driver current source and the method may further comprise controlling the first biasing current and the second biasing current while adjusting bias levels of the at least one cascoded laser diode driver current source to prevent electrical overstress conditions on components of the laser driver circuit.

In an example embodiment, a light emitted by the laser diode may be modulated prior to the completion of the diverting the first biasing current and the second biasing current.

In an example embodiment, the first biasing current and the first modulation current may be generated concurrently.

In an example embodiment, diverting the first biasing current to the second biasing current and switching between the first modulation current and the second modulation current may be performed concurrently.

In an example embodiment, generating the first modulation current and/or diverting the first biasing current to the second biasing current may be delayed until a voltage at the first node of the laser driver circuit has stabilized.

In a further aspect, the present disclosure provides a method to control biasing and modulation currents of a laser diode circuit during a power-down operation. The method comprises diverting a first modulation current flowing through a laser diode of the laser diode circuit and a first node connected to a first terminal of the laser diode to a second modulation current flowing through a second node connected to a second terminal of the laser diode and bypassing the laser diode; diverting a first biasing current flowing through the laser diode and the first node to a second biasing current flowing through the second node and bypassing the laser diode; decreasing the second biasing current to a value corresponding to a power-down mode of the laser diode circuit; and decreasing the second modulation current to a value corresponding to a power-down mode of the laser diode circuit.

In an example embodiment, the method may further comprise diverting the first biasing current to the second biasing current at a rate maintained within a first power-down biasing threshold limit to prevent electrical overstress conditions on components of the laser driver circuit.

In an example embodiment, the method may further comprise decreasing the second biasing current at a rate maintained within a second power-down biasing threshold limit to prevent electrical overstress conditions on components of the laser driver circuit.

In an example embodiment, the method may further comprise decreasing the second modulation current at a rate maintained within a first power-down modulation threshold limit to prevent electrical overstress conditions on components of the laser driver circuit.

In an example embodiment, decreasing the second biasing current and decreasing the second modulation current may be performed concurrently.

In another aspect, the present disclosure provides a method to control biasing and modulation currents of a laser diode circuit during a current adjustment operation. The method comprises diverting a first modulation current, drawn by a first modulation current source from a first node connected to a first terminal of a laser diode of the laser diode circuit, to a second modulation current flowing through a second node connected to a second terminal of the laser diode and bypassing the laser diode using a second modulation current source; diverting a first biasing current, drawn by a first biasing current source from the first node, to the second node and bypassing the laser diode using a second biasing current source; adjusting the first modulation current to a modulation current target value and/or the first biasing current to a biasing current target value; diverting the second biasing current to the adjusted first biasing current; and diverting the second modulation current to the adjusted first modulation current.

In an example embodiment, the current adjustment operation may be performed during a current adjustment window in an optical communication network.

In an example embodiment, the method may further comprise interrupting the current adjustment operation when the current adjustment window is closed or interrupted; and resuming the current adjustment operation during a subsequent current adjustment window.

In an example embodiment, the method may further comprise adjusting the first biasing current at a rate maintained within a current-adjustment biasing threshold limit to prevent electrical overstress conditions on components of the laser driver circuit.

In an example embodiment, the method may further comprise adjusting the first modulation current at a rate maintained within a current-adjustment threshold limit to prevent electrical overstress conditions on components of the laser driver circuit.

In an aspect, the present disclosure provides a non-transitory machine-readable medium storing statements and instructions for execution by a processor to execute the methods disclosed herein.

In a further aspect, the present disclosure provides a laser diode circuit comprising a laser diode, a laser diode driver, a first laser diode biasing inductor, a second laser diode biasing inductor, a modulator and a biasing current controller. The laser diode includes an anode and a cathode. The laser diode driver includes a first biasing current source, a second biasing current source, a first modulation current source, and a second modulation current source. The first biasing current source and the first modulation current source are connected to the anode of the laser diode at a first node and the second modulation current source is connected to the cathode of the laser diode at a second node. The first laser diode biasing inductor has one end connected to the anode of the laser diode at the first node and another end connected to a voltage supply. The second laser diode biasing inductor has one end connected to the cathode of the laser diode at the second node and another end connected the second biasing current source of the laser diode driver. The modulator is configured to switch between a first modulation current and a second modulation current to modulate a light emitted by the laser diode, the first modulation current flowing through the first node and bypassing the laser diode, the second modulation current flowing through the laser diode and the second node. The biasing current controller is configured to divert a first biasing current to a second biasing current to bias the laser diode, the first biasing current flowing through the first node and bypassing the laser diode, and the second biasing current flowing through the laser diode and the second node.

In an example embodiment, the modulator may be further configured to modulate a light emitted by the laser diode in accordance with a digital pattern to be transmitted over an optical communication channel.

In an example embodiment, the biasing current controller may be further configured to vary a rate of generation of the first biasing current over time, the rate of generation of the first biasing current being maintained within a first biasing threshold limit to prevent electrical overstress conditions on components of the laser driver circuit and to prevent spurious light emissions from the laser diode.

In an example embodiment, the biasing current controller may be further configured to the divert the first biasing current to the second biasing current at a rate maintained within a second biasing threshold limit to prevent electrical overstress conditions on components of the laser driver circuit.

In an example embodiment, the laser diode circuit may further comprise at least one cascoded laser diode driver current source and the biasing current controller may be further configured to control the first biasing current and the second biasing current while adjusting bias levels of the at least one cascoded laser diode driver current source to prevent electrical overstress conditions on components of the laser driver circuit.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 6 is a flowchart for controlling biasing and modulations currents of a laser diode circuit in accordance with an aspect of the present disclosure.

FIG. 7 is a power up current profile according to an aspect of the present disclosure.

FIG. 12 is a flowchart for controlling biasing and modulations currents of a laser diode circuit during a current adjustment operation in accordance with an aspect of the present disclosure.

DETAILED DESCRIPTION

Generally, the present disclosure provides a method and apparatus for powering up and powering down a laser diode and its driver. Embodiments of the present disclosure enable the use of deep sub-micron CMOS technology to build a laser diode driver (LDD), while ensuring the low voltage limits prescribed by such technology are not exceeded. Building an LDD with deep sub-micron CMOS technology pushes circuit integration further ahead, bringing cost of LDDs and required board circuits down.

Figure 1:
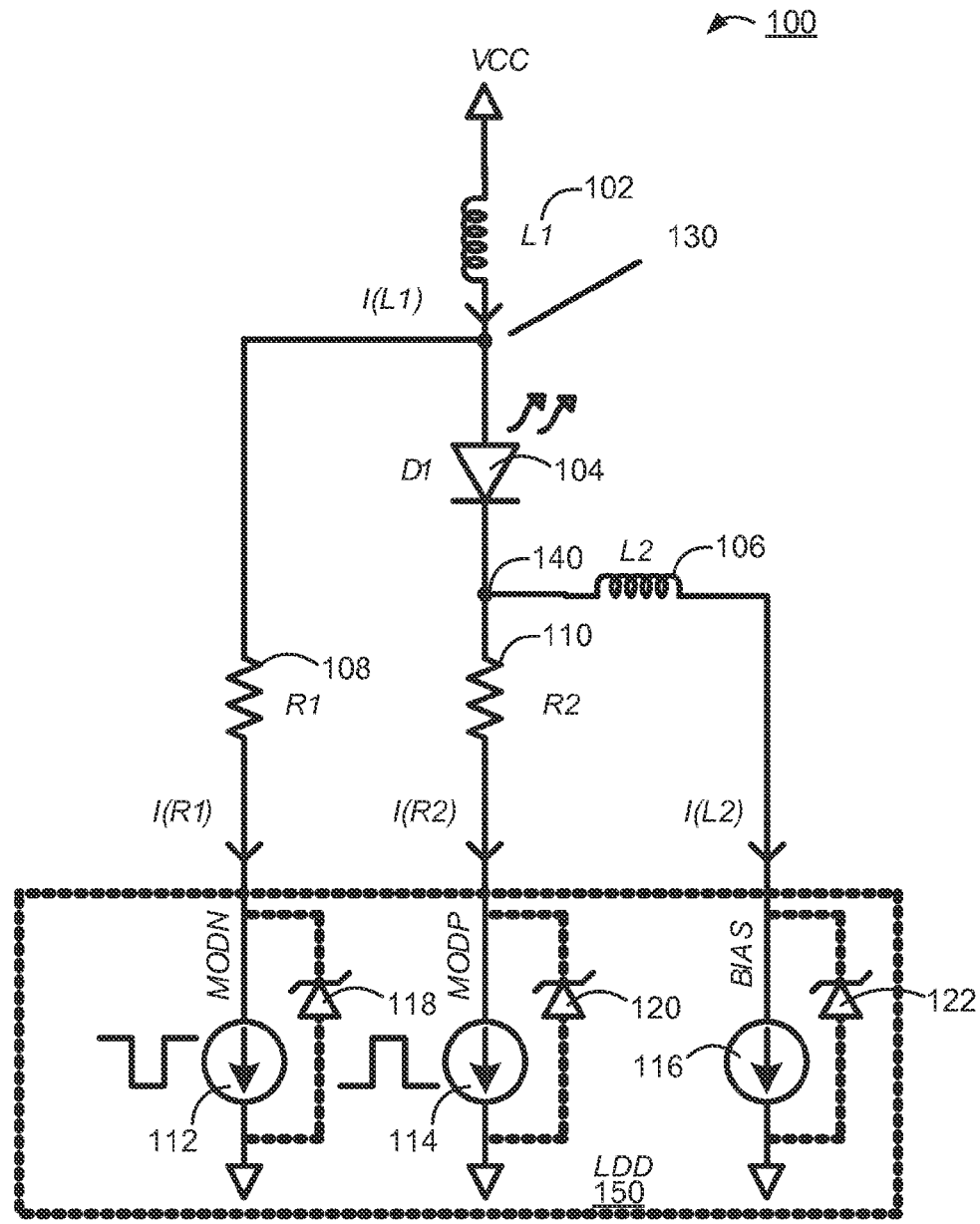
FIG. 1 is a known laser diode driver circuit model.

A common characteristic of LDDs is that they evolve in highly inductive environments. FIG. 1 illustrates a schematic circuit model 100 representing a known board topology including an LDD 150, a laser diode 104 and other discrete components. The represented LDD circuit 150 comprises three pins 112, 114, 116, two of which (MODP and MODN) are used for modulating the current of the laser diode 140, and the other (BIAS) for biasing the laser diode 140.

Several inductors, for example, L1 102 connected to the anode 130 of the laser diode 104 and L2 106 connected to the cathode 140 of the laser diode 104 can be found in the circuit model 100. The circuit model 100 may in addition include resistive elements R1 108 and R2 110. The packaged laser diode typically contributes to these inductors. These inductive elements resist current changes according to the relation:

$$V = L \, dI/dt \qquad \text{Equation 1}$$

It follows from Equation 1 that sharp current changes (i.e., high dI/dt) can lead to high induced voltages. The presence of large capacitors (not shown in FIG. 1) also creates complex oscillatory responses to voltage or current transients, commonly known as LC tank responses, which can exacerbate the voltage excursions.

These voltages pose a significant reliability problem for LDDs implemented in deep sub-micron CMOS technologies, as they can damage voltage sensitive devices, or at least decrease their lifetime expectancy. Maximum absolute ratings of 2.0V between any two terminals are common in recent CMOS technology. This implies that both too high and too low voltages at the LDD pins can create reliability problems.

Figure 2:
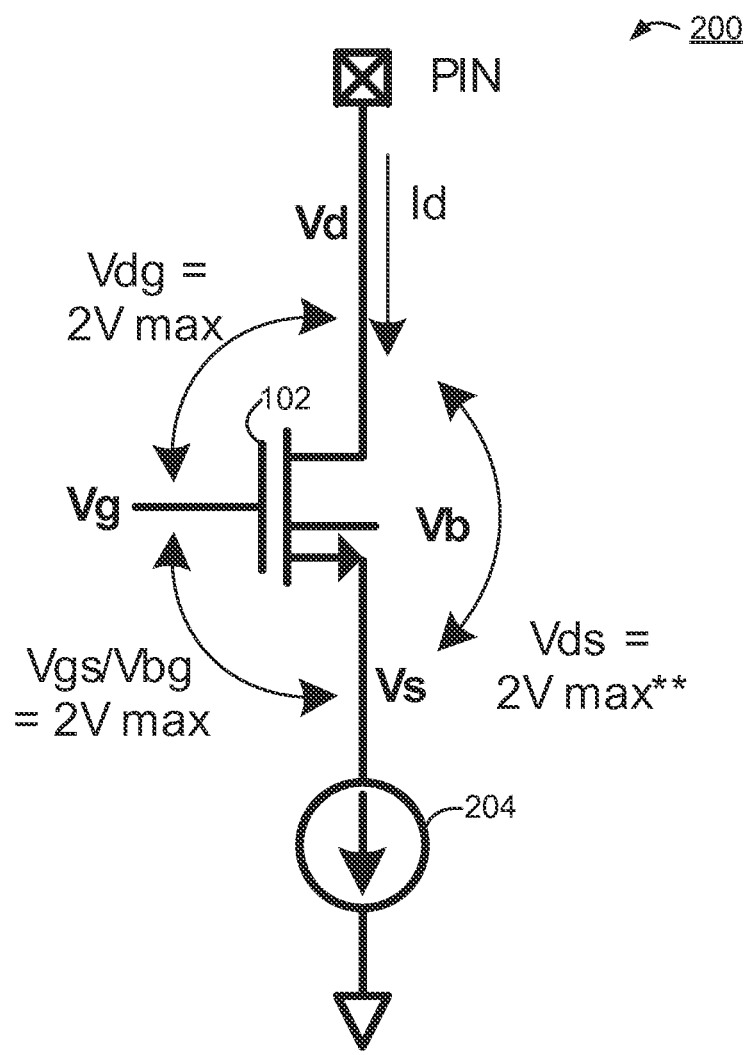
FIG. 2 is a cascoded current source circuit model.

The circuit model 200 of FIG. 2 illustrates the need for maximum or minimum voltage limits at the LDD pins. FIG. 2 represents a classical cascoded N-type metal-oxide-semiconductor (NMOS) current source 204 that can be used in an LDD to drive any of its terminals. The current source 204 lies at the bottom and is shielded from the output by a cascoding device. The device voltage limits are set to 2V in this example. The potential at the shield's source node is normally expressed as:

$$V_s = V_g - V_{th} - V_{\mathit{eff}} \text{ if } V_d \geq V_g - V_{th} \qquad \text{Equation 2}$$

where $V_g$ represents the gate bias potential of the device, $V_{th}$ is the conduction threshold of the device, and $V_{eff}$ represents an overdrive voltage required for letting the current flow through. If the pin voltage ($V_d$) reaches too high a value, the voltage difference across drain and source ($V_{ds}$) and possibly across drain and gate ($V_{dg}$) of the shield can exceed 2V. On the other hand, if $V_d$ drops too low, the shield's $V_{gs}$ may exceed the process limit as well. Indeed, for a transistor in the $V_d < V_g - V_{th}$ condition, $V_s$ closely tracks $V_d$, such that $V_s = V_d - V_{eff}$. Thus, $V_{gs} = V_{gd} + V_{eff}$ can exceed $V_{gs\_max}$ when $V_{gd}$ approaches 2V.

In the example circuit model 100 of FIG. 1, a constant current flows through inductor L1 (I(L1)) when the circuit is powered up. The constant current represents the sum of the modulation and bias currents. The current sources on MODP and MODN are modulated in opposition, so as to keep their sum constant. They steer the modulation current out of the laser diode when MODN is active and MODP is inactive, while they drive it through the laser diode when MODP is active and MODN is inactive. According to Equation 1, a constant current through inductor L1 (i.e., dI/dt=0) produces a constant voltage at the anode of the laser diode which equals the $V_{cc}$ supply potential, if no lossy element is inserted in series with L1. Voltage overshoots may be minimized by keeping 41) as steady as possible.

However, since inductors L1 and L2 can have high inductance value, certain changes in the biasing conditions of this circuit lead to voltage transients. Two such changes in the biasing conditions are of particular interest: (1) when the current flowing through the $V_{cc}$ supply changes, consequently altering the current magnitude in L1 as well; and (2) when the bias current of the laser diode (taking the BIAS path) changes, consequently altering the current magnitude in both L1 and L2. These changes in biasing conditions are typically seen during powering up or powering down of the laser diode, as well as during bias and modulation current adjustments.

Powering up a laser diode usually involves bringing up currents in the MODN and BIAS branches. Consequently, current in L1 is increased, usually from zero to the level required for biasing and modulating the laser diode; and current in L2 is also increased as a function of the bias current.

Some burst mode protocols such as Ethernet passive optical network (EPON) or gigabit passive optical network (GPON) mandate quick laser turn-on/turn-off times, thus requiring rapid changes in the bias current of the laser diode. To reduce power, it is also desirable to remove the biasing currents when the circuit is powered down; the bias current nevertheless needs to be brought up quickly when the circuit is powered up.

Figure 3:
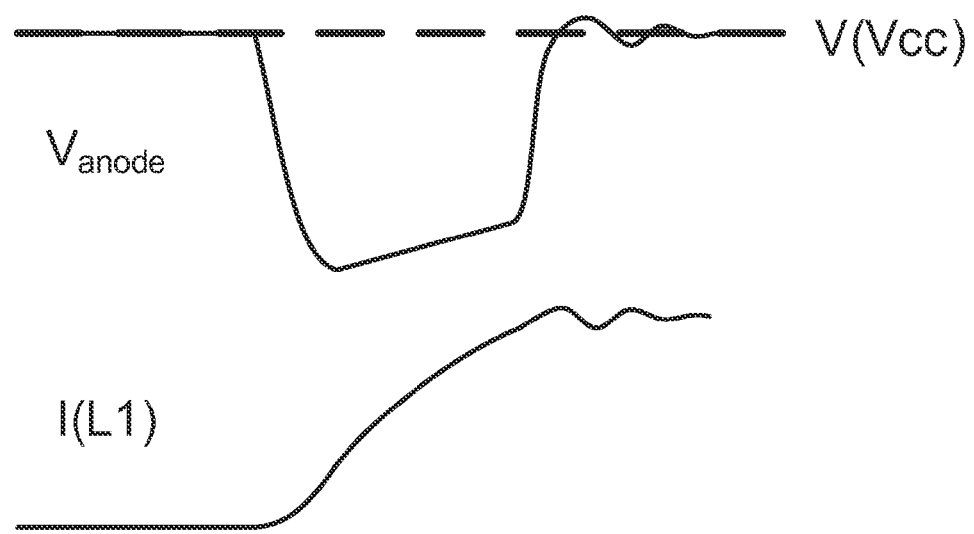
FIG. 3 is an illustration of sudden increase of LDD currents.

FIG. 3 provides an illustration of sudden increases in currents drawn by the LDD. Specifically, the laser diode anode voltage with the supply voltage overlaid in dotted line (top) and the L1 inductance current I(L1) (bottom) are shown. These sudden increases cause the voltage at the anode 130 of the laser diode 104 to decrease at a rate proportional to the current's magnitude and inversely proportional the capacitive elements (either parasitic or real) found in the circuit. The system reaches a state where the voltages at the LDD pins are too low for the LDD current sources to sustain their desired current output. Through this starvation mechanism, an equilibrium condition is reached where the current sources match the current flowing through inductance L1. As current builds into L1, the voltage across the LDD's current sources increases and the output current follows accordingly. Thereafter, the voltage at the anode of the laser diode overshoots above the $V_{cc}$ supply as part of the natural response of any LC tank. A large positive voltage overshoot is also seen at the pins of the LDD. It is noted that L2 also resists current changes, but in common cases where L2<<L1, L1 dominates the overall response.

The magnitude of the voltage undershoot at the pins of the LDD depends primarily on the rate of change of the current and the value of inductance L1. Instantaneous current changes are resisted by L1 and result in the LDD's current sources reducing their output current, because their output voltage is brought down by the voltage build-up on inductor L1.

Powering down a laser diode usually involves bringing down current from the MODN and BIAS branches. Setting these currents to zero suddenly causes the voltage at the anode of the laser diode to spike, since L1 instantaneously acts as a current source. The current generated by L1 induces a large enough voltage to turn on the LDD's electro-static discharge (ESD) protections (functionally represented in FIG. 1 by the Zener diodes 118, 120, 122 in parallel with the current sources). These ESD protections start to conduct significant current only after their input voltage reaches a certain threshold. When the reduction of the bias current is quick and poorly controlled, the voltage at the input pins of the LDD reaches the threshold voltage most of the time and is maintained until current into L1 settles near zero.

The magnitude of the voltage overshoots depends on several factors, for example: (1) Rate of current changes; (2) Component properties (resistance, inductance, capacitance, diode threshold and resistance, etc.); (3) Clamp thresholds and ON resistance (and possibly supply levels if clamps are referred to supply potentials); and (4) Stray elements (such as parasitic values associated with board trace or device inductance/capacitance/resistance).

In the example described above, sudden changes in currents result in voltage transients, either positive or negative, that can potentially damage the LDD if voltage clamping is not adequate. On the other hand, voltage clamp designs with low enough ON resistance may exhibit excessive capacitance at the LDD pins, since a typical way to lower the ON resistance of a protection structure is to increase its area, which in turn increases its parasitic capacitances. These capacitances slow down the response time of the circuit, and fundamentally limit the rate at which the optical fiber link can be operated. Simply relying on big clamps is therefore unacceptable for many situations.

Additionally, strongly inhibiting the voltage overshoots of L1 through clamping may also impair its main function—to open up the optical eye. Thus, overshoots are valuable from a performance perspective (for example, when modulation is taking place), but detrimental from an electrical overstress perspective. Accordingly, a delicate balance must be struck between clamping and eye opening. However, electrical overstress constraints may prevail.

From the previous example, it is apparent that sudden changes in currents can lead to spurious light emissions because protection clamps, by virtue of limiting voltages at the LDD pins, allow currents to flow through branches which are nominally unbiased.

This phenomenon is illustrated using the powering down scheme of the LDD shown in FIG. 1. For simplicity, the effect of inductor L2 is neglected. Initially, the modulation is such that only the biasing current flows through the laser diode. The modulation current flows through the MODN source (i.e., I(R1)), while the MODP current (i.e., I(R2)) is zero. A constant biasing current flows through the BIAS source (i.e., I(L2)). To power down the laser diode circuit, the current through MODN as well as the current through the BIAS source is brought to zero. Both the modulation and biasing currents flow through inductor L1. Even if their sources are interrupted, inductance L1 continues to generate a current until the magnetic energy it has accumulated is dissipated. The reactive current generated by the inductor can only flow through MODN or through the laser diode. In order for the current not to flow through the laser diode, it would have to flow only through MODN. In this case, the voltage reached at the anode of the laser diode after a sudden interruption of the modulation and bias currents can be expressed as:

$$V_{anode} = V^*_{MODN} + R_1 \times I(L_1)$$
$$\Rightarrow V_{anode} - V^*_{MODN} = R_1 \times I(L_1)$$

Equation 3 where $V^*_{MODN}$ represents the clamped voltage at the MODN pin, i.e., the voltage at which the current flows through the ESD protection circuit represented by a Zener Diode in FIG. 1. To conduct any current when their current sources are off, the MODP and BIAS nodes also need to reach their clamping voltages, which are approximately the maximum voltages they can attain. For simplicity, these voltages are assumed to be identical for all pins, i.e., $V^*_{MODN} \approx V^*_{MODP} \approx V^*_{BIAS}$. At the onset of the laser diode conduction, therefore:

$$V_{anode} - V^*_{BIAS} = V_{THRESH\_LD} = R_1 \times I(L_1) = V_{anode} - V^*_{MODN}$$

Equation 4 where $V_{THRESH\_LD}$ is the laser diode conduction threshold. Once this threshold is crossed, voltage across the laser diode stabilizes and most of the excess current that would normally increase the $R_1 \times I(L_1)$ term is diverted through the laser diode such that $R_1 \times I(L_1) \approx V_{THRESH\_LD}$. In this case, the excess current flows through the ESD protection circuits of the BIAS and MODP nodes.

Figure 4:
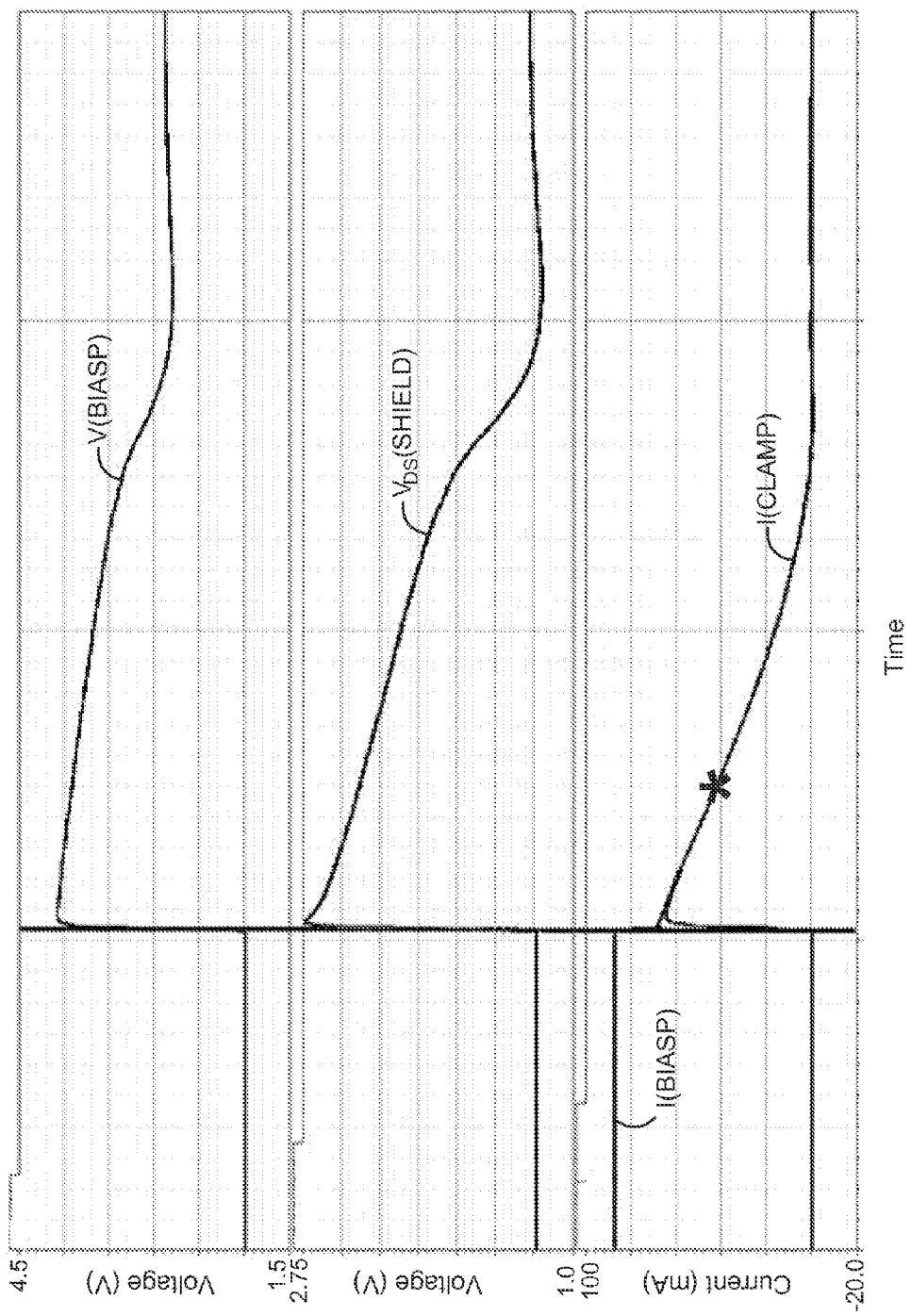
FIG. 4 is a temporal representation of voltage and current during an abrupt laser power down.

FIG. 4 illustrates an example of an abrupt LDD shutdown. The top voltage vs. time graph of FIG. 4 represents the voltage at the LDD's BIAS pin; the middle voltage vs. graph represents the $V_{ds}$ of a cascode transistor inside the BIAS current source (see FIG. 2) as an example of the internal node's voltages inside an LDD; and the bottom current vs. time graph shows the current through the LDD's BIAS current source and the current flowing through the LDD's BIAS clamps.

In this example, the LDD's current sources are instantly cut-off at the vertical marker (represented by the vertical line). However current still flows through the BIAS pin, passing through the protection clamps instead of the current sources. The voltage at the BIAS pin reaches 4V and the voltage across some of the LDD's internal devices could potentially exceed the limit allowed by the technology. At shut-off, the current through node MODP (not shown) reaches similar levels as the current through node BIAS, even though it's initial value was zero before the shut-off, and the sum of the current through the BIAS source and that through the MODP source flows through the laser diode. Assuming the laser diode current before the power down (see bottom graph of FIG. 4 left of the vertical marker) is biasing the laser diode close to emitting light, the current after the power down (see bottom graph of FIG. 4 right of the vertical marker) is sufficient to emit light until the instant noted by the asterisk in the bottom graph of FIG. 4. Although the discharge of the energy accumulated in L1 is sped up by the discharge path through the laser diode, the effective power-down time of the laser diode is increased.

While responses vary widely according to factors cited earlier, a sudden shutdown of the LDD's current sources does not translate into an immediate interruption of the laser diode's current, and that some components can get stressed by the high induced voltage peaks that it causes.

Modifying the board topology and the ESD protection circuits alone cannot get rid of these issues without a significant reduction of the communication system's performance.

As described previously, maximum voltage at the LDD pins should be limited during the laser diode's current (or voltage) transients, to avoid electrical overstress (EOS) situations and spurious light emission by the laser diode. Several optical communication protocols, such as EPON or GPON, mandate quick laser turn-on and turn-off times. Specifically, EPON or GPON is a burst-mode protocol where several units can communicate over a single shared fiber. Laser turn-on and turn-off times must therefore be minimized to reduce transmission overhead and maximize link bandwidth. For these applications, the setup illustrated in FIG. 1 is unsuitable because of the slow BIAS current ramping time required to prevent large voltages at the LDD pins.

Accordingly, embodiments of the present disclosure provide circuits and methods to prevent electrical overstress and spurious light emission during laser diode turn-on and/or turn off. Additionally, embodiments of the present disclosure provide circuits and methods to adjust biasing currents throughout the lifetime of the laser diode.

Figure 5:
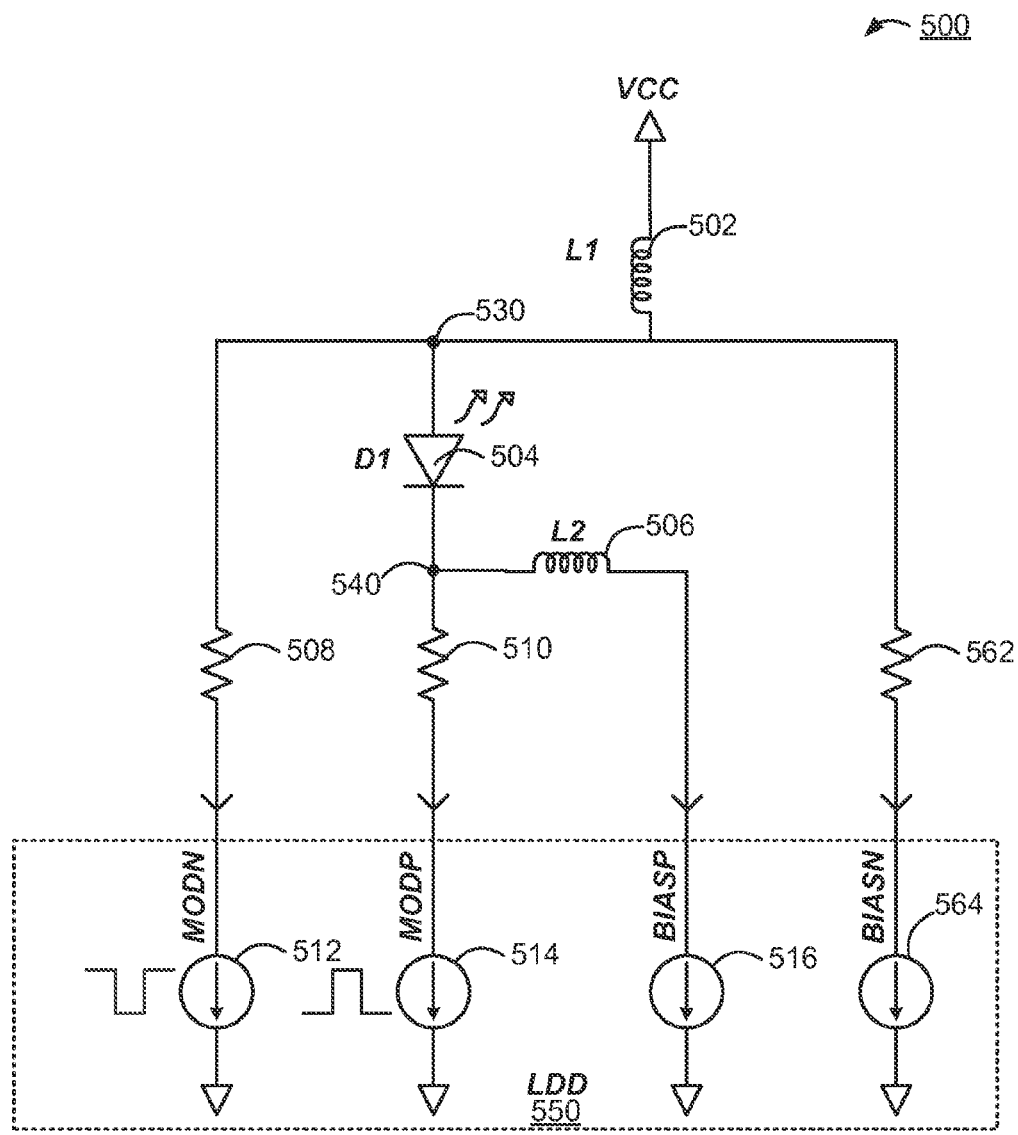
FIG. 5 is a laser diode driver circuit model in accordance with an aspect of the present disclosure.

In an aspect, the present disclosure provides a laser diode circuit as illustrated in FIG. 5. The laser diode circuit 500 comprises a laser diode 504, a laser diode driver 550, a first laser diode biasing inductor 502, a second laser diode biasing inductor 506, a modulator and a biasing current controller (not shown in FIG. 5). The laser diode 504 includes an anode and a cathode. The laser diode driver 550 includes a first biasing current source 564, a second biasing current source 516, a first modulation current source 512, and a second modulation current source 514. The first biasing current source 564 and the first modulation current source 512 are connected to the anode of the laser diode 504 at a first node 530 and the second modulation current source 514 is connected to the cathode of the laser diode 504 at a second node 540. The first laser diode biasing inductor 502 has one end connected to the anode of the laser diode 504 at the first node 530 and another end connected to a voltage supply $V_{CC}$. The second laser diode biasing inductor 506 has one end connected to the cathode of the laser diode 504 at the second node 540 and another end connected the second biasing current source 516 of the laser diode driver 550. The modulator (not shown) is configured to switch between a first modulation current MODN and a second modulation current MODP to modulate a light emitted by the laser diode 504. The first modulation current MODN flows through the first node 530 bypassing the laser diode 504. The second modulation current MODP flows through the laser diode 504 and the second node 540. The biasing current controller (not shown) is configured to divert a first biasing current BIASN to a second biasing current BIASP to bias the laser diode 504. The first biasing current BIASN flows through the first node 530 bypassing the laser diode 504. The second biasing current BIASP flows through the laser diode 504 and the second node 540. The laser diode circuit 500 may additionally include resistive elements 508, 510, 562, as shown in FIG. 5.

Example embodiments of the present disclosure take advantage of the fact that the inductance value of L2 is usually significantly smaller than that of L1. Thus, for a given limit on the voltage induced by current changes in these inductors, the current through L2 can be ramped up or ramped down more quickly than the current through L1. The laser diode driver 550 of the laser diode circuit 500 comprises four pins. Two pins are used for modulating the current (MODN 512 and MODP 514) of the laser diode 504. The other two pins (BIASP 516 and BIASN 564) are used for biasing purposes. The current through BIASN is changed slowly during power-on and power-off operations. Also, the biasing current flowing through BIASN is ramped down or up simultaneously as the current source for BIASP is ramped up or down. The sum of BIASP and BIASN currents is therefore kept constant, avoiding changes in the current flowing into L1 as well. Thus, harmful voltage transients associated with rapid L1 current changes are prevented. Also, switch-over between the BIASN and BIASP currents can be performed much faster than the current ramp time required to reach the final bias current of L1, since these overshoots are in proportion to the smaller inductance L2.

The modified responses for the circuit model 500 of FIG. 5, where switch-over between BIASP and BIASN is performed, are examined in detail below.

As described earlier, any sudden change in modulation and/or bias currents results in voltage transients, either positive or negative, that can potentially damage the LDD. In an example embodiment, the current ramp-up and ramp-down are performed in a specific order with specific ramp characteristics to prevent light emission and to ensure that voltage limits of the LDD's internal components are not exceeded.

In an aspect, the present disclosure provides a method to control biasing and modulation currents of a laser diode circuit as illustrated in the flowchart of FIG. 6. The method 600 comprises generating a first biasing current to pre-charge a laser diode supply biasing inductor of the laser diode circuit, the first biasing current flowing through a first node connected to a first terminal of a laser diode of the laser diode circuit while bypassing the laser diode (at 605); generating a first modulation current to pre-charge the laser diode supply biasing inductor, the first modulation current flowing through the first node while bypassing the laser diode (at 610); diverting the first biasing current from the first node to a second biasing current flowing through the laser diode and a second node connected to a second terminal of the laser diode (at 615); and switching between the first modulation current flowing through the first node and a second modulation current flowing through the laser diode and the second node to modulate a light emitted by the laser diode (at 620).

For ease of understanding, the components of the method illustrated in FIG. 6 may be related to the components of the laser diode circuit 500 of FIG. 5 as follows. The first biasing current and the second biasing current are analogous to BIASN and BIASP, respectively. The first modulation current and the second modulation current are analogous to MODN and MODP, respectively. The laser diode supply biasing inductor is analogous to inductor L1 502. The first node and second node are analogous to first node 530 and second node 540, respectively.

In an example embodiment, powering up the laser diode involves bringing currents up in the MODN and BIASN branches, and then switching BIASN current over to BIASP. This results in two main operations: (1) during the first step, current in L1 is brought from zero to the level required for biasing and modulating the laser driver at a rate of change (for example, a slow rate of change) that prevents voltage overstress at the LDD pins; and (2) during the latter step, current is switched from BIASN over to BIASP at a much steeper rate of change compared to step 1 such that the laser diode is quickly turned on.

In an aspect, the present disclosure provides a method to control biasing and modulation currents of a laser diode circuit during a power-down operation as illustrated in the flowchart of FIG. 7. The method 700 comprises diverting a first modulation current flowing through a laser diode of the laser diode circuit and a first node connected to a first terminal of the laser diode to a second modulation current flowing through a second node connected to a second terminal of the laser diode and bypassing the laser diode (at 705); diverting a first biasing current flowing through the laser diode and the first node to a second biasing current flowing through the second node and bypassing the laser diode (at 710); decreasing the second biasing current to a value corresponding to a power-down mode of the laser diode circuit (at 715); and decreasing the second modulation current to a value corresponding to a power-down mode of the laser diode circuit (at 720).

For ease of understanding, the components of the method illustrated in FIG. 7 may be related to the components of the laser diode circuit 500 of FIG. 5 as follows. The first modulation current and the second modulation current are analogous to MODP and MODN, respectively. The first biasing current and the second biasing current are analogous to BIASP and BIASN, respectively. The first node and second node are analogous to second node 540 and the first node 530, respectively. The reversal of the notation is simply reflective of the reversal in the nature of operation during the powering up and powering down processes.

Powering down the laser diode involves switching BIASP current over to BIASN first, and then disabling currents flowing into the MODN and BIASN branches. This results in two main operations: (1) during the first step, current is switched out of L2 from BIASP over to BIASN, such that the LD is rapidly turned off; and (2) during the second step, current in L1 is brought to zero from the level required for biasing and modulating the laser driver at rate of change (for example, a slow rate of change) that prevents voltage overstress at the LDD pins and avoids emitting light through the laser diode.

The above power-up and power-down sequences have at least the following benefits over conventional methods. For a given maximum voltage and current at the LDD and laser diode pins, the maximum turn-on and turn-off time of the current flowing through the laser diode is limited by L2 rather than L1; the laser diode turn-on and turn-off can thus be done much faster. The rate of the current change through L1 can be adjusted independently of the turn-on and turn-off times of the laser diode because spurious light emissions are prevented during power-down. The controlled rates for current ramp-up and ramp-down into L1 mitigate electrical overstress issues on the LDD's internal devices.

Figure 8:
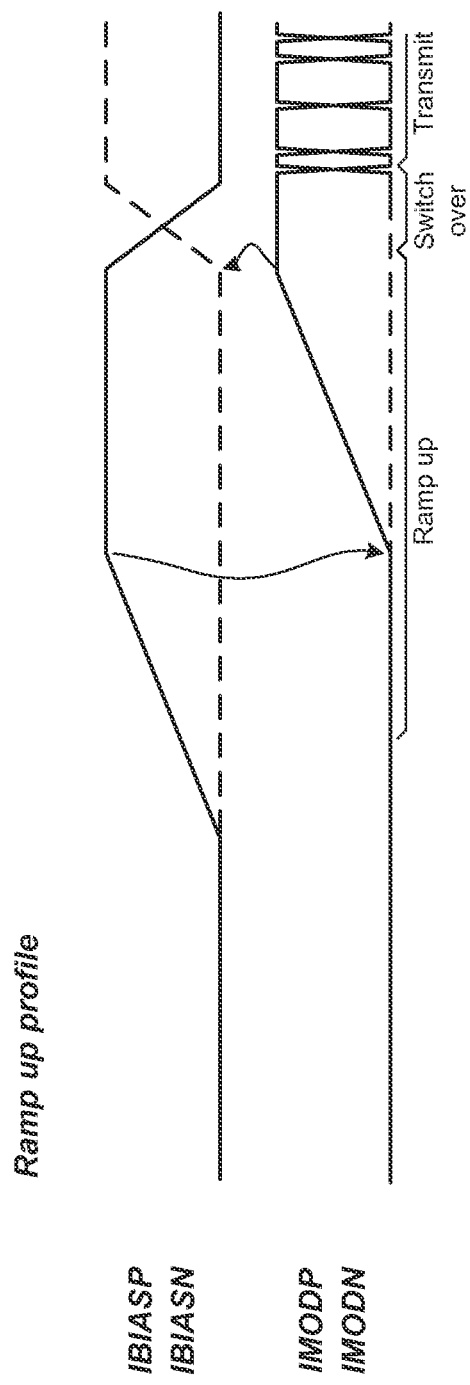
FIG. 8 is a flowchart for controlling biasing and modulations currents of a laser diode circuit during a power-down operation in accordance with an aspect of the present disclosure.
Figure 9:
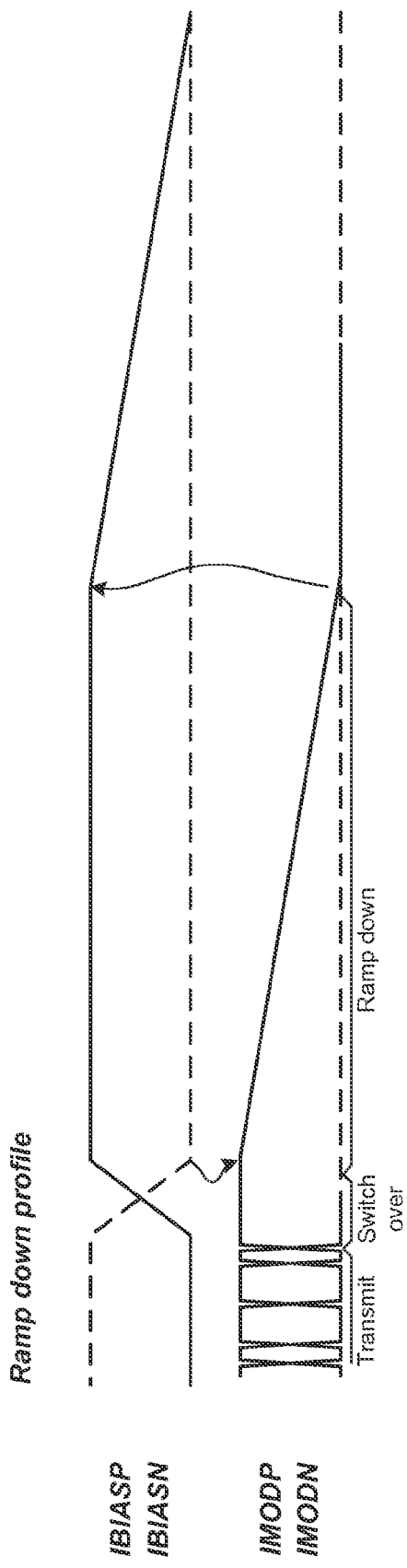
FIG. 9 is a power down current profile according to an aspect of the present disclosure.

FIG. 8 illustrates the currents generated by an example embodiment to power-up the laser diode circuit to active mode and FIG. 9 illustrates the currents generated by an example embodiment to power-down the laser diode circuit to a quiescent state, respectively. These diagrams illustrate the currents through the circuit model shown in FIG. 5.

The slopes for ramp-up and ramp-down are shown as asymmetrical in FIGS. 8 and 9, since the current magnitude on the modulation and bias side can be different. Also, the rate of change of current need not be identical, as ramp up and ramp down result in different induced voltages across the LDD's pins, so different timing requirements may apply.

Various methods for altering the currents can be contemplated. For example, a current-mode DAC may be digitally controlled where control codes are sequentially produced at a rate that enforces the desired ramp-up or ramp-down rate. In another example, ramping can be performed in a purely analog manner, where the rate of change is controlled by current charging capacitors.

In an example embodiment, the power-up method may include the following steps: (1) slowly ramping up the current into BIASN up to its final target value; (2) slowly ramping up the current in MODN up to its final target value; (3) rapidly switching the current from BIASN over to BIASP, keeping the sum of the currents in BIASN and BIASP constant; and (4) modulating the laser diode by switching the current between MODN and MODP as a function of the data to be transmitted.

For steps 1 and 2, the current variation rate is dictated by L1, other board components and the minimum voltage that can be tolerated at the LDD pins. For step 3, switch-over rate is dictated by L2. Also other factors may have to be considered in determining the ramp-up or switch-over rate. For example, the voltage at BIASP must not dip too low and the voltages at BIASN, MODN and MODP must not spike too high. In addition, industry standards' specifications may also mandate maximum turn-on times.

In some example implementations, overlap between steps 3 and 4 may be allowed. For other example implementations, steps 1 and 2 may overlap, be interchanged, or even omitted if currents are already ramped up. When steps 1 and 2 occur simultaneously, an upper limit for the rate of current change of the sum of bias and modulation currents may be set, for example, so as to not exceed the rate of current change of the bias or modulation current when steps 1 or 2 are performed separately.

In other example embodiments, steps 1, 2, 3 and 4 may be delayed relative to one another so as to allow some internal circuit nodes to fully settle.

As described earlier, minimum voltage limits may also apply in addition to maximum voltage limits at the LDD pins. To accommodate these limits, transistor bias voltages may be adjusted throughout the procedure. For instance, in the circuit model of FIG. 2, the gate potential of the shield device could be adjusted during the ramping phases as an enhancement to the EOS mitigation measures.

In the embodiment described above, light output modulation begins in step 4 after currents are ramped-up and bias current is completely switched over into BIASP so as to flow through the laser diode. At this time, modulation current can be steered in and out of the laser diode without causing EOS because the current flowing through L1 and L2 remains relatively constant throughout the process.

The above power up sequence has at least the following benefits over conventional methods. For a given maximal voltage and current at the LDD and laser diode pins, the maximum turn-on time of the current flowing through the laser diode is limited by L2 rather than L1; LD turn-on can thus be done much faster. The controlled rates for current ramp-up into L1 mitigate electrical overstress issues and prevent spurious light emissions.

In an example embodiment, the power-down method may include the following steps: (1) interrupting the laser diode modulation and statically diverting the modulation current into MODN; (2) rapidly switching the bias current from BIASP over to BIASN, keeping the sum of both currents constant; (3) slowly ramping down the current in MODN; and (4) slowly ramping down the current in BIASN.

In step 2, the maximum switch-over rate depends on several factors, but largely on the L2 value, the maximum tolerable voltage at BIASP and the minimum tolerable voltages at BIASN, MODP and MODN. Industry standards' specifications may also mandate maximum turn-off times. During steps 3 and 4, the voltage rises at the LD anode. The maximum current variation rate is dictated by L1, the maximum tolerable voltages at the LDD pins and the allowable voltage drop across the LD before it starts emitting light.

In some example implementations, overlap between steps 1 and 2 may be allowed. For other implementations, steps 3 and 4 may overlap, be interchanged, or even omitted. For instance, very closely spaced consecutive bursts may require skipping current ramp-down/up altogether, if the ramping duration exceeds the interval separating these bursts. Also, the end target current in power down mode could be 0 A, or higher than 0 A. When steps 3 and 4 occur simultaneously, an upper limit for the rate of current change of the sum of bias and modulation currents may be set, for example, so as to not exceed the rate of current change of the bias or modulation current when steps 3 or 4 are performed separately.

In other example embodiments, steps 1, 2, 3 and 4 may be delayed relative to one another so as to allow some internal circuit nodes to fully settle.

As described earlier, minimum voltage limits may also apply in addition to maximum voltage limits at the LDD pins. Accordingly, transistor bias voltages may be adjusted throughout the procedure to accommodate these limits. For instance, in the circuit model of FIG. 2, the gate potential of the shield device could be adjusted during the ramping phases as an enhancement to the EOS mitigation measures.

The above power down sequence has at least the following benefits over conventional methods. For a given maximum voltage and current at the LDD and laser diode pins, the maximum turn-off time of the current flowing through the laser diode is limited by L2 rather than L1; laser diode turn-off can thus be done much faster. The controlled rates for current ramp-down into L1 mitigate electrical overstress issues and prevent generating spurious light emission.

For the power-up and power-down sequences described above, target current magnitudes may differ on the modulation and bias sides. Indeed, the magnitude of bias current in a laser diode is largely function of its lasing threshold, which represents the amount of current required before the diode starts emitting coherent light. However, the magnitude of the modulation current depends on the targeted extinction ratio, which represents the ratio between the power when transmitting a digital 1 and the power when transmitting a digital 0. These two properties are somewhat independent and result in different bias and modulation currents.

For each of power-up, power-down and current adjustments, the rate of changes for each of MODN, MODP, BIASN and BIASP sources are individually optimized, according to at least the following characteristics: minimum and maximum voltage restrictions at each LDD pin; the topology of the circuit, including parasitic elements; initial and final current magnitudes; and target transition time.

Due to the nature of the LDD circuit, its non-linear elements and the complex responses of its various passive and active elements, it may not be possible to establish a general closed form equation to calculate the different current variation rates for each case. Those skilled in the art will recognize that this optimization can, however, be performed by standard circuit simulation techniques, for example using a SPICE simulator. The value of the components of the circuit can also be modified to obtain the desired characteristics, including but not limited to the minimum and maximum voltage limits of each component, the modulation rate, the minimum and maximum bias current magnitudes, and the minimum and maximum modulation current magnitudes.

Figure 10:
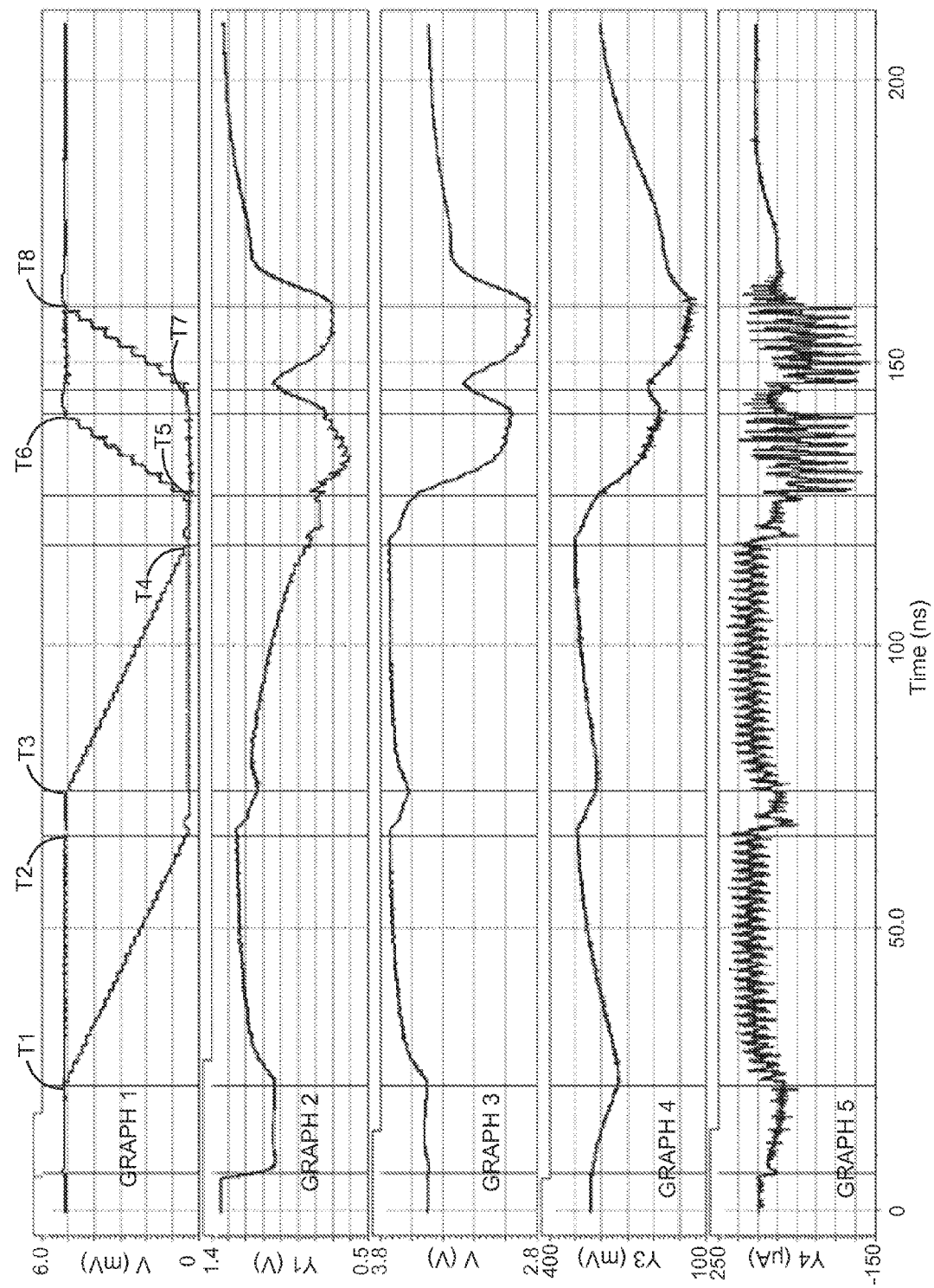
FIG. 10 is a current profile of a power down immediately followed by a power up according to an aspect of the present disclosure.
Figure 11:
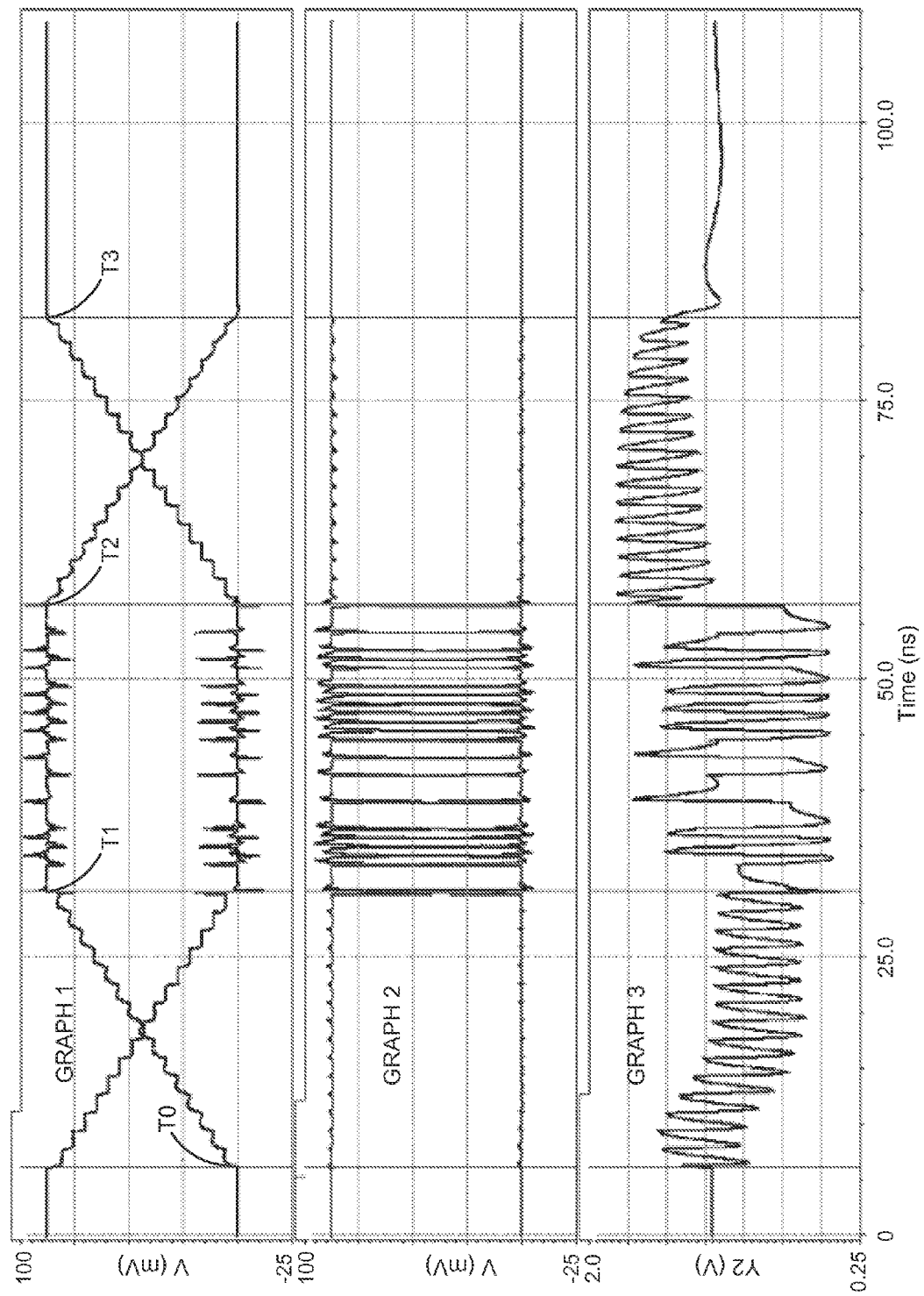
FIG. 11 is a bias current switchover profile according to an aspect of the present disclosure.

FIG. 10 shows an example of a current power down immediately followed by a power up in accordance with an aspect of the present disclosure. The bias current switch-over is shown in FIG. 11. The two situations are shown independently, however they may appear in sequence. The graphs in FIG. 10 can be interpreted as follows:

Graph 1 shows the modulation (MODN) and bias (BIASN) currents;

Graph 2 shows the voltage induced across the drain and source of a device internal to the LDD;

Graph 3 shows the induced voltage at the anode of the laser diode;

Graph 4 shows the voltage induced across the laser diode; and

Graph 5 shows the current flowing through the laser diode branch.

The events occurring during the marked intervals are:

T1-T2 Bias current is ramped-down to 0;
T2-T3 Rest period;
T3-T4 Modulation current is ramped-down to 0;
T4-T5 Rest period;
T5-T6 Modulation current is ramped-up to target;
T6-T7 Rest period;
T7-T8 Bias current is ramped-up to target.

In the example embodiment of FIG. 10, both the ramp-down and ramp-up procedure are performed in an orderly manner. The ramping rates are chosen according to the induced voltages tolerated by the fabrication technology—in this case, ramp-down requires a longer time than ramp-up to keep all devices within their safe operating region. Ramp down is also performed so as to keep the laser off: Graph 4 shows the voltage across the laser diode is kept below 350 mV at all times, and Graph 5 shows the resulting current in the laser branch stays below 200 µA—in this example, these values can be considered small enough to keep laser from emitting spurious light. It should be noted that rates could have been chosen so as to exhibit even lower voltages/currents across/through the laser diode.

FIG. 11 illustrates an example of a bias current switch-over—ramp-up and ramp-down is omitted in this illustration for readability purposes and is assumed to take place outside of this window (see example illustrated in FIG. 10). The graphs can be read as follows:

Graph 1 shows the BIASP and BIASN bias currents;
Graph 2 shows the MODP and MODN bias currents; and
Graph 3 shows the voltage induced across the drain and source of a device internal to the LDD.

The events occurring during the marked intervals are:

T0-T1 Bias current is switched-over into the laser;
T1-T2 Modulation current is switched in and out of the laser, achieving light pulse modulation;
T2-T3 Bias current is switched-over out of the laser.

As expected, the bias switchover takes place within a shorter time span than the ramping process exemplified in FIG. 10. Accordingly, quicker laser turn-on and turn-off times, independent on the inductor L1, are achieved.

Laser characteristics can change over time as temperature drifts and as the device ages, and this is normally compensated by adjusting the bias and/or modulation currents. Accordingly, an aspect of the present disclosure provides a method to control biasing and modulation currents of a laser diode circuit during a current adjustment operation as illustrated in FIG. 12. The method 1200 comprises diverting a first modulation current, drawn by a first modulation current source from a first node connected to a first terminal of a laser diode of the laser diode circuit, to a second modulation current flowing through a second node connected to a second terminal of the laser diode and bypassing the laser diode using a second modulation current source (at 1205); diverting a first biasing current, drawn by a first biasing current source from the first node, to the second node and bypassing the laser diode using a second biasing current source (at 1210); adjusting the first modulation current to a modulation current target value and/or the first biasing current to a biasing current target value (at 1215); diverting the second biasing current to the adjusted first biasing current (at 1220); and diverting the second modulation current to the adjusted first modulation current (at 1225).

For ease of understanding, the components of the method illustrated in FIG. 12 may be related to the components of the laser diode circuit 500 of FIG. 5 as follows. The first modulation current and the second modulation current are analogous to MODP and MODN, respectively. The first biasing current and the second biasing current are analogous to BIASP and BIASN, respectively. The first node and second node are analogous to second node 540 and the first node 530, respectively. The reversal of the notation is simply reflective of the starting point in the current adjustment operation.

In an example embodiment, the method comprises: (1) steering the modulation current statically into MODN; (2) switching bias current from BIASP to BIASN, keeping the sum of both currents constant; (3) ramping up or down the modulation, bias, or both currents to their new targets according to the rates as described earlier; (4) switching bias current back from BIASN back to BIASP, keeping the sum of both currents constant; and (5) starting modulation of the laser current.

In some example embodiments, overlap between steps 1 and 2, and/or between steps 4 and 5 may be tolerated. In case both modulation and bias currents need to be adjusted, these adjustments may be done sequentially. Current updates are pursued until the new target are reached, but may be paused and resumed if necessary.

The above method may be used when the laser diode can stop emitting light without affecting the overall optical system. This may be performed either when the device generating the traffic payload is not enabled, is in calibration mode, or during specific times where light emission can be interrupted without impacting the established communication channel. For example, in burst mode systems, transmission occurs during predefined/finite time windows. These windows are usually granted according to parameters such as bandwidth allocation of optical network units (ONUs) and the number of such units. For example, in passive optic networks, ONUs are communication devices that reside at customer premises. Since the channel bandwidth is shared by all ONUs connected to a common optical fiber, each ONU emits in rotation during specific time windows. Thus, steps 4 and 5 precede a transmission window, whereas steps 1 and 2 occur at the end of such a window. Step 3 may occur in between transmission windows.

Some example implementations may rely on a state machine to orchestrate transmission windows which operates independently from the engine responsible for adjusting current magnitudes. As such, commands to update these current targets may arrive asynchronously relatively to transmission window grants, and possibly coincide with an actively ongoing transmission. The current update procedure described above can be enhanced such that all requests for current updates are queued and executed only when the LDD is not transmitting. In some other example implementations, requests received during an ongoing current update may result in the end target being instantaneously adjusted and ramping direction and slope may consequently be changed, if needed.

Some updates requiring long ramp times may not be entirely fulfilled if transmission windows are spaced too closely. In such situations, the ramping process may pause at the end of the actual update window and resume when a later window occurs. If a current update command is received after a given update phase is over or has not started yet (as for instance, getting a modulation current update when the bias current is being updated), the new target is registered but the update only takes place when the proper update phase occurs.

Embodiments of the present disclosure may be applied in burst-mode transmission operations and continuous mode transmission operations. For instance, in burst-mode transmission applications, the methods described herein may be adapted to current ramping phases in-between bursts, and ramping phases only applied when the unit interfacing the optical fiber is powered down or enters a low power mode. For example, between bursts, a system may resort to only the current switch-over phase. In the continuous transmission case, the method described herein may be adapted to take the laser offline to re-adjust its parameters.

Thus, an elegant solution for ramping up and ramping down currents in a laser diode has been presented. The embodiments described in the present disclosure enable integration of a laser diode driver into recent CMOS processes, thus allowing for a reduction in the bill of materials (BOM) and a simplification in the IC design and development process.

Embodiments of the present disclosure have been described mainly with respect to high speed current mode transmitters, such as the laser drivers found in 1.25 Gbps EPON applications. However, they may be used in any application where similar inductive load schemes can be found that need to be driven by EOS sensitive devices.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A laser diode circuit comprising:
a laser diode having an anode and a cathode;
a laser diode driver including a first biasing current source, a second biasing current source, a first modulation current source, and a second modulation current source, the first biasing current source and the first modulation current source being connected to the anode of the laser diode at a first node and the second modulation current source being connected to the cathode of the laser diode at a second node;
a first laser diode biasing inductor with one end connected to the anode of the laser diode at the first node and another end connected to a voltage supply;
a second laser diode biasing inductor with one end connected to the cathode of the laser diode at the second node and another end connected the second biasing current source of the laser diode driver;
a modulator configured to control the modulating current of the laser diode by switching between a first modulation current and a second modulation current to modulate a light emitted by the laser diode, the first modulation current flowing through the first node and bypassing the laser diode, the second modulation current flowing through the laser diode and the second node;
at least one cascoded laser diode driver current source; and
a biasing current controller configured to control the biasing current of the laser diode by switching between a first biasing current to a second biasing current to bias the laser diode, the first biasing current flowing through the first node and bypassing the laser diode, and the second biasing current flowing through the laser diode and the second node, the biasing current controller being further configured to control the first biasing current and the second biasing current while adjusting bias levels of the at least one cascoded laser diode driver current source to prevent electrical overstress conditions on components of the laser driver circuit.

2. The laser diode circuit of claim 1, wherein the modulator is further configured to modulate a light emitted by the laser diode in accordance with a digital pattern to be transmitted over an optical communication channel.

3. The laser diode circuit of claim 1, wherein the biasing current controller is further configured to:
vary a rate of generation of the first biasing current over time, the rate of generation of the first biasing current being maintained within a first biasing threshold limit to prevent electrical overstress conditions on components of the laser driver circuit and to prevent spurious light emissions from the laser diode.

4. The laser diode circuit of claim 1, wherein the modulator is further configured to:
vary a rate of generation of the first modulation current over time, the rate generation of the first modulation current being maintained within a first modulation threshold limit to prevent electrical overstress conditions on components of the laser driver circuit and to prevent spurious light emissions from the laser diode.

5. The laser diode circuit of claim 1, wherein the biasing current controller is further configured to:
divert the first biasing current to the second biasing current at a rate maintained within a second biasing threshold limit to prevent electrical overstress conditions on components of the laser driver circuit.

* * * * *